United States Patent
Lee

(10) Patent No.: US 12,238,444 B2
(45) Date of Patent: Feb. 25, 2025

(54) IMAGE SENSOR AND SIGNAL CONVERTING METHOD

(71) Applicant: SK hynix Inc., Icheon-si Gyeonggi-do (KR)

(72) Inventor: Jung Han Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 149 days.

(21) Appl. No.: 18/082,338

(22) Filed: Dec. 15, 2022

(65) Prior Publication Data

US 2024/0022834 A1 Jan. 18, 2024

(30) Foreign Application Priority Data

Jul. 18, 2022 (KR) ........................ 10-2022-0088438

(51) Int. Cl.
 *H04N 25/78* (2023.01)
(52) U.S. Cl.
 CPC ................................... *H04N 25/78* (2023.01)
(58) Field of Classification Search
 CPC .. H04N 25/75; H04N 25/772; H04N 25/7795; H04N 25/78
 See application file for complete search history.

(56) References Cited

U.S. PATENT DOCUMENTS

| 7,907,429 B2 | 3/2011 | Ramadass et al. |
| 10,715,035 B2 | 7/2020 | Li et al. |
| 2011/0292261 A1* | 12/2011 | Hwang ................. H04N 25/76 348/294 |

FOREIGN PATENT DOCUMENTS

| KR | 1020080046484 A | 5/2008 |
| KR | 1020170049143 A | 5/2017 |

* cited by examiner

*Primary Examiner* — Daniel M Pasiewicz
(74) *Attorney, Agent, or Firm* — WILLIAM PARK & ASSOCIATES LTD.

(57) ABSTRACT

An image sensor includes a first capacitor for sampling a coarse ramp signal, a second capacitor for sampling a sum of a voltage of the first capacitor and a fine ramp signal, and a comparator for generating a comparison signal obtained by comparing a pixel voltage received from a pixel with the voltage of the first capacitor or a voltage of the second capacitor. The image sensor further includes a data output unit for outputting bit data corresponding to the pixel, based on the comparison signal.

27 Claims, 8 Drawing Sheets

IMAGE SENSOR AND SIGNAL CONVERTING METHOD

CROSS-REFERENCE TO RELATED APPLICATION

The present application claims priority under 35 U.S.C. § 119(a) to Korean patent application number 10-2022-0088438, filed on Jul. 18, 2022, in the Korean Intellectual Property Office, the entire disclosure of which is incorporated herein by reference.

BACKGROUND

1. Technical Field

The present disclosure generally relates to an image sensor, and more particularly, to an image sensor and an analog-digital signal converting method.

2. Related Art

An image sensor may be generally classified as a Charge Coupled Device (CCD) image sensor or a Complementary Metal Oxide Semiconductor (CMOS) image sensor. Recently, the CMOS image sensor which has low manufacturing cost, low power consumption, and easy integration with a peripheral circuit has received attention.

A single-slope ADC is frequently used as an analog-digital converter of the image sensor. The single-slope ADC may have a simple structure, a small occupied area, and a high linear output, as compared with other ADCs.

Because the single-slope ADC requires a clock cycle of a multiple of 2, power consumption may be increased in acquisition of a high-resolution image. Accordingly, it is necessary to devise a 2-step signal converting operation for implementing a high-resolution ADC while not excessively increasing an operation frequency.

SUMMARY

Some embodiments provide an image sensor and a signal converting method, in which a voltage obtained by sampling a coarse ramp signal is stored, thereby using the stored voltage when a sampling voltage of a fine ramp signal is generated.

In accordance with an embodiment of the present disclosure, an image sensor includes: a first capacitor configured to sample a coarse ramp signal; a second capacitor configured to sample a sum of a voltage of the first capacitor and a fine ramp signal; a comparator configured to generate a comparison signal obtained by comparing a pixel voltage received from a pixel with the voltage of the first capacitor or a voltage of the second capacitor; and a data output unit configured to output bit data corresponding to the pixel, based on the comparison signal.

In accordance with the present disclosure, a signal converting method includes: storing, in a first capacitor, a first sampling voltage with respect to a coarse ramp signal received corresponding to a coarse ramp signal request; generating a first comparison signal, based on the first sampling voltage and a pixel voltage with respect to a pixel; storing, in a second capacitor, a second sampling voltage with respect to a sum of a fine ramp signal received corresponding to a fine ramp signal request and the first sampling voltage; generating a second comparison signal, based on the second sampling voltage and the pixel voltage; and generating bit data, based on the first comparison signal and the second comparison signal.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural and functional descriptions disclosed herein are merely illustrative for the purpose of describing embodiments according to the concept of the present disclosure. The embodiments according to the concept of the present disclosure can be implemented in various forms, and should not be construed as being limited to the embodiments set forth herein.

Hereinafter, embodiments of the present disclosure will be described in detail with reference to the accompanying drawings in order for those skilled in the art to be able to implement the technical spirit of the present disclosure.

Figure 1:
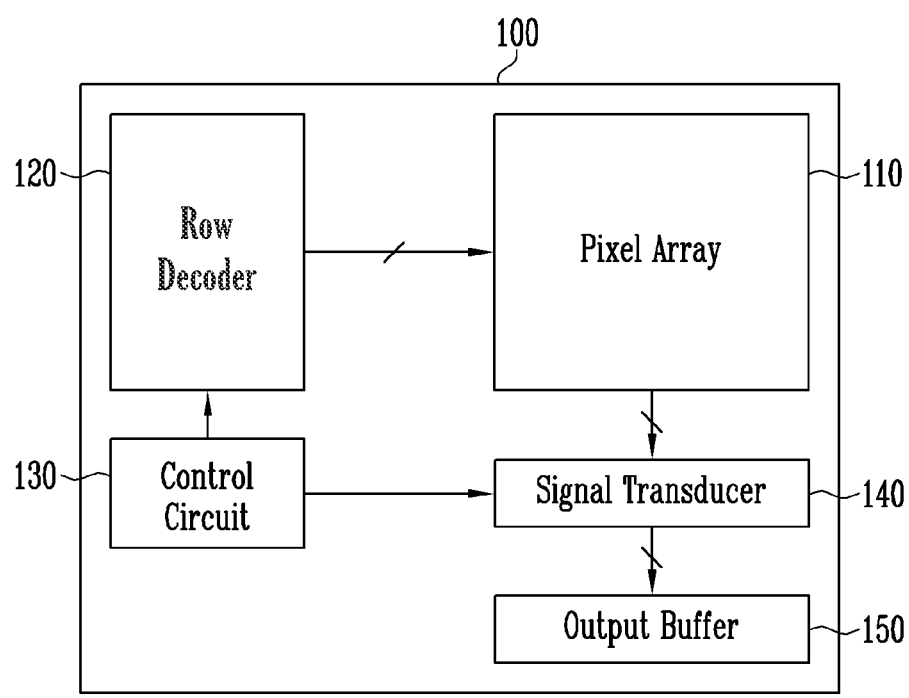
FIG. 1 is a diagram illustrating an image sensor in accordance with an embodiment of the present disclosure.

FIG. 1 is a diagram illustrating an image sensor in accordance with an embodiment of the present disclosure.

Referring to FIG. 1, the image sensor 100 may include a pixel array 110, a row decoder 120, a controller 130, a signal transducer 140, and an output buffer 150. The controller 130 is also referred to as a control circuit, as illustrated in FIG. 1.

The pixel array 110 may include a plurality of pixels for outputting color information included in incident light. Specifically, each of the plurality of pixels may accumulate photocharges generated according to incident light, and generate a pixel signal corresponding to the accumulated photocharges. Each of the pixels may include a photoelectric conversion element (e.g., a photo diode, a photo transistor, a photogate, or a pinned photo diode) for converting an optical signal into an electrical signal and at least one transistor for processing an electrical signal.

The pixel array 110 may include a plurality of pixels arranged in a row direction and a column direction. The pixel array 110 may generate a plurality of pixel signals for each row. Each of the plurality of pixel signals may be an analog type pixel signal.

The pixel array 110 may include a color filter array including color filters which allow only a specific wavelength (e.g., red, blue, or green) of light incident onto each pixel to pass therethrough. The pixel signal may represent an intensity of the light having the specific wavelength, which passes through the color filter array.

The row decoder 120 may select one row among a plurality of rows on which the plurality of pixels are arranged in the pixel array 110 in response to an address and control signals, which are output from the controller 130.

The controller 130 may generate control signals for controlling the image sensor 100. The controller 130 may output the generated control signals, thereby controlling open/close operations of switches included in the image sensor 100.

The signal transducer 140 may include an internal amplifier which amplifies a pixel signal generated in the pixel array 110. The signal transducer 140 may receive pixel signals from each of columns of the pixel array 110, and change a magnitude of the pixel signals according to a gain value of the internal amplifier.

The signal transducer 140 may convert a plurality of analog type pixel signals into a plurality of digital type pixel values. The plurality of digital type pixel values may be output in various patterns. The signal transducer 140 may perform correlated double sampling (CDS) on each of signals output from the pixel array 110 in response to the control signals output from the controller 130, and output each of digital signals by performing analog-digital conversion on each of the signals on which the CDS is performed.

In an embodiment of the present disclosure, the signal transducer 140 may output pixel data converted into a digital signal by comparing a pixel signal with a ramp signal. The signal transducer 140 may sample a pixel signal corresponding to each of the columns. The signal transducer 140 may include a comparator which compares a pixel signal with respect to each column with a ramp signal and a counter.

The output buffer 150 may be implemented with a plurality of buffers with store digital signals output from the signal transducer 140. Specifically, the output buffer 150 may latch and output each pixel data in a column unit, which is provided from the signal transducer 140. The output buffer 150 may temporarily store pixel data output from the signal transducer 140, and sequentially output the pixel data under the control of the controller 130. In accordance with an embodiment of the present disclosure, the output buffer 150 may be omitted.

Figure 2:
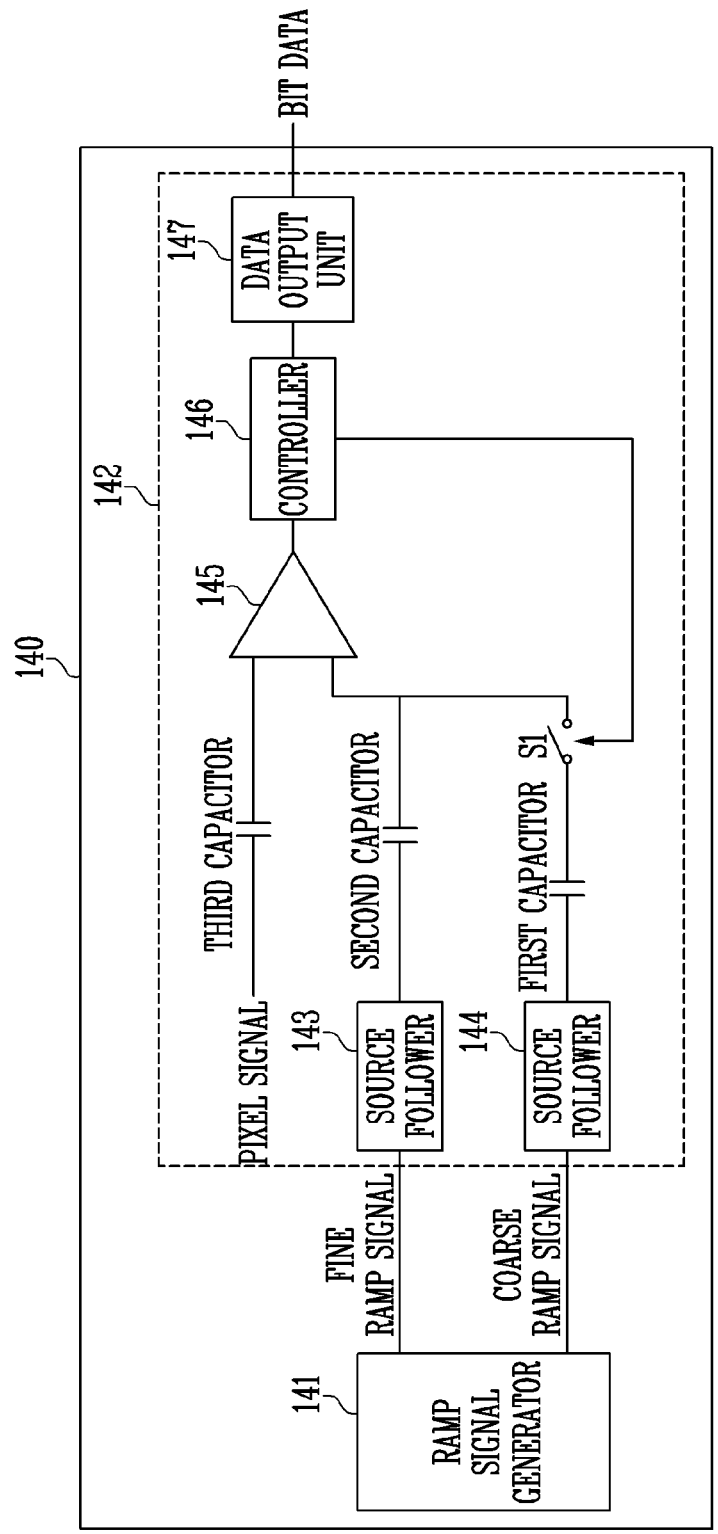
FIG. 2 is a block diagram illustrating a signal transducer shown in FIG. 1.

FIG. 2 is a block diagram illustrating the signal transducer shown in FIG. 1.

Referring to FIG. 2, the signal transducer 140 may include a ramp signal generator 141 and an analog-digital converter 142. The signal transducer 140 may convert a pixel signal as an analog signal into bit data as a digital signal, based on a pixel signal received from columns of pixels and a ramp signal. The signal transducer 140 may perform a 2-step single slope analog-digital converting operation. In the 2-step single slope analog-digital converting operation, a portion of bit data may be generated based on a coarse ramp signal and a pixel signal, and the other of the bit data may be generated based on a fine ramp signal and the pixel signal.

The ramp signal generator 141 may generate a coarse ramp signal or a fine ramp signal, corresponding to a ramp signal request. The ramp signal generator 141 may output the coarse ramp signal and the fine ramp signal through different output terminals.

The analog-digital converter 142 may generate bit data, based on a pixel signal and a ramp signal. The ramp signal may be a reference signal of the analog-digital converting operation. The analog-digital converter 142 may include a first source follower 144 connected to an output terminal of the coarse ramp signal and a second source follower 143 connected to an output terminal of the fine ramp signal. The first source follower 144 and the second source follower 143 may output a voltage of a received signal.

The analog-digital converter 142 may include a first capacitor connected to the first source follower 144, a second capacitor connected to the second source follower 143, a switch S1 which connects the first capacitor and the second capacitor to each other, a comparator 145 which compare a pixel signal and a ramp signal with each other, and a controller 146 which stores a comparison result and controls the switch S1. The first capacitor may sample a coarse ramp signal, corresponding to reception of the coarse ramp signal. The first capacitor may store a voltage corresponding to the coarse ramp signal.

The second capacitor may sample a fine ramp signal, corresponding to reception of the fine ramp signal. A third capacitor may sample a pixel signal, and store a voltage corresponding to the pixel signal. The comparator 145 may generate a comparison signal by comparing the pixel signal sampled by the third capacitor with the sampled coarse ramp signal or the sampled fine ramp signal.

The ramp signal generator 141 may output only one signal selected from the coarse ramp signal and the fine ramp signal. For example, when the ramp signal generator 141 outputs the coarse ramp signal, a reference voltage may be output at the output terminal of the fine ramp signal. When the ramp signal generator 141 outputs the fine ramp signal, a ground voltage may be output at the output terminal of the coarse ramp signal.

While the first source follower 144 receives the coarse ramp signal, the switch S1 may transfer the voltage stored in the first capacitor to the second capacitor. The controller 146 may transfer a turn-off control signal to the switch S1, corresponding to a change in comparison signal. When the switch S1 is turned off, the voltage stored in the second capacitor may be constantly maintained.

The controller 146 may generate bit data, based on the comparison signal of the comparator 145. The controller 146 may generate upper bits of the bit data, corresponding to reception of the coarse ramp signal. The controller 146 may generate lower bits of the bit data, corresponding to reception of the fine ramp signal. The controller 146 may further include a latch which stores the generated bits. The controller 146 may convert a pixel signal as an analog signal into bit data as a digital signal, based on the bits stored in the latch.

In an embodiment of the present disclosure, when assuming that the bit data has 12 bits, the controller 146 may generate 5 bits of the bit data, corresponding to the reception of the coarse ramp signal, and generate the other 7 bits of the bit data, corresponding to the reception of the fine ramp signal. The image sensor of the present disclosure performs a high-resolution analog-digital converting operation, and can reduce power consumption and shorten time required, as compared with a 1-step analog-digital converting operation.

In an embodiment of the present disclosure, the analog-digital converter 142 may further include a data output unit 147 which outputs bit data about a pixel, based on the comparison signal.

Figure 3:
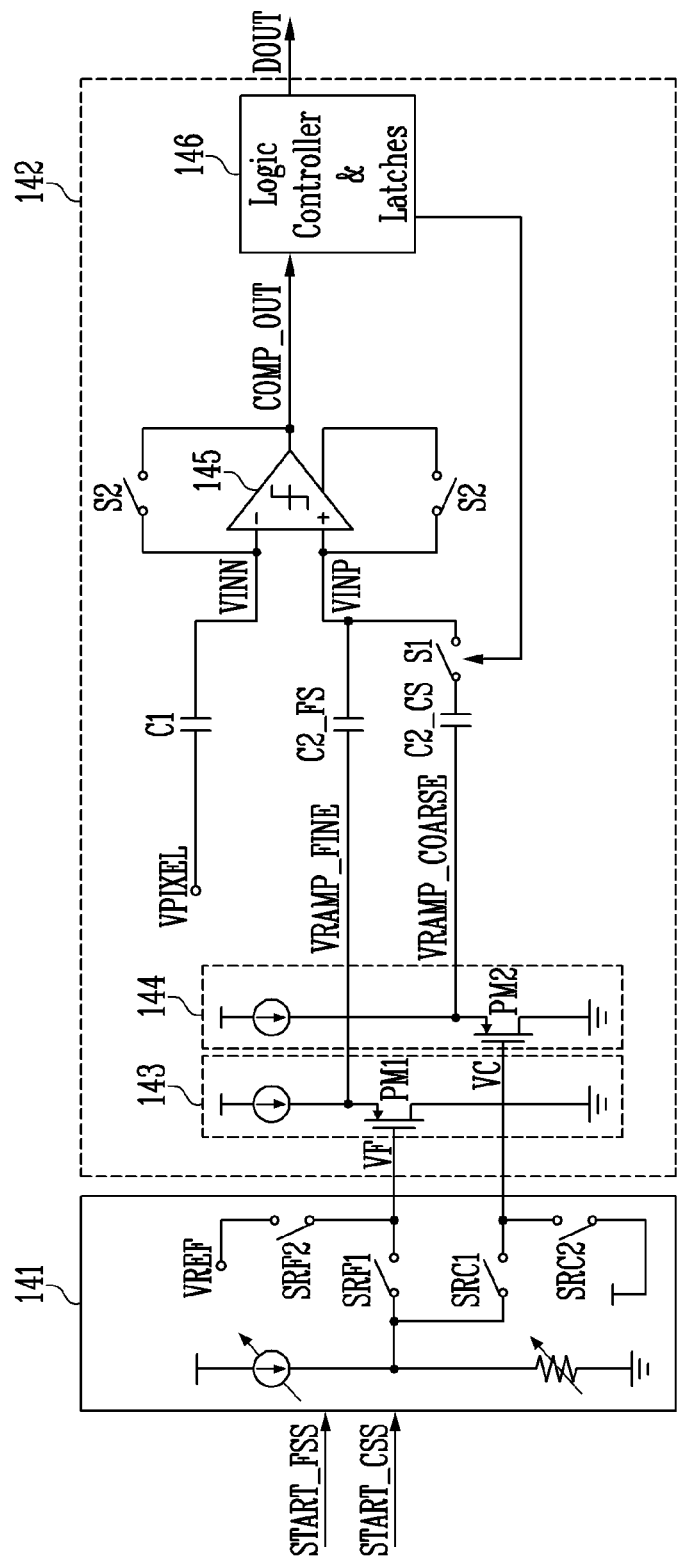
FIG. 3 is a circuit diagram illustrating a ramp signal generator and an analog-digital converter in accordance with an embodiment of the present disclosure.

FIG. 3 is a circuit diagram illustrating a ramp signal generator and an analog-digital converter in accordance with an embodiment of the present disclosure.

Referring to FIG. 3, the ramp signal generator 141 and the analog-digital converter 142 may include a plurality of switches and a plurality of capacitors. The circuit diagram shown in FIG. 3 is merely one of many possible embodiments for the present disclosure.

The ramp signal generator 141 may generate a coarse ramp signal or a fine ramp signal from the same source. The ramp signal generator 141 may output the coarse ramp signal, corresponding to a coarse ramp signal request START_CSS. Similarly, the ramp signal generator 141 may output the fine ramp signal, corresponding to a fine ramp signal request START_FSS.

The ramp signal generator 141 may include a first switch SRC1 which connects between the source and an output terminal of the coarse ramp signal, a second switch SRC2 which connects between the output terminal of the coarse ramp signal and a ground, a third switch SRF1 which connects between the source and an output terminal of the fine ramp signal, and a fourth switch SRF2 which connects between the output terminal of the fine ramp signal and a reference voltage input terminal. In an embodiment of the present disclosure, the first switch SRC1 and the second switch SRC2 may form a first switch pair, and the third switch SRF1 and the fourth switch SRF2 may form a second switch pair. A turn-on operation and a turn-off operation may be complementarily performed on switches included in each switch pair. For example, when the first switch SRC1 is turned on, the second switch SRC2 may be turned off. Similarly, when the first switch SRC1 is turned off, the second switch SRC2 may be turned on.

The switches SRC1, SRC2, SRF1, and SRF2 included in the ramp signal generator 141 may alternately perform the turn-on operation or the turn-off operation, thereby outputting the coarse ramp signal or the fine ramp signal to the analog-digital converter 142.

In an embodiment of the present disclosure, a first source follower 144 may receive the coarse ramp signal from the ramp signal generator 141, and a second source follower 143 may receive a reference voltage from the ramp signal generator 141. A first capacitor C2_CS may sample the coarse ramp signal, corresponding to the reception of the coarse ramp signal. The first capacitor C2_CS may store a voltage corresponding to the coarse ramp signal. A switch S1 may be turned on corresponding to the reception of the coarse ramp signal. The switch S1 may transfer the voltage stored in the first capacitor C2_CS to a second capacitor C2_FS. A third capacitor C1 may sample a pixel signal VPIXEL, and store a voltage corresponding to the pixel signal VPIXEL.

The voltage stored in the first capacitor C2_CS may be applied to a positive input terminal VINP of a comparator 145. The voltage stored in the third capacitor C1 may be applied to a negative input terminal VINN of the comparator 145. The comparator 145 may compare the voltage stored in the first capacitor C2_CS with the voltage stored in the third capacitor C1, corresponding to the reception of the coarse ramp signal. The comparator 145 may change an output value of a comparison signal COMP_OUT, corresponding to that the voltage applied to the negative input terminal VINN is lower than or equal to the voltage applied to the positive input terminal VINP. For example, the output value of the comparison signal COMP_OUT may be changed from HIGH to LOW, corresponding to that the voltage applied to the negative input terminal VINN is lower than or equal to the voltage applied to the positive input terminal VINP.

A controller 146 may store the comparison signal COMP_OUT of the comparator 145 in a latch. In an embodiment, the controller 146 represents a logic controller with multiple latches, as illustrated in FIG. 3. The controller 146 may generate upper bits of bit data DOUT by counting the comparison signal COMP_OUT. The controller 146 may transmit a turn-off control signal to the switch S1, corresponding to a change in the comparison signal COMP_OUT. The voltage applied to the positive input VINP of the comparator 145, corresponding to turn-off of the switch S1, may be constantly maintained. The second capacitor C2_FS may store a residual voltage stored in the first capacitor C2_CS while the coarse ramp signal is received.

In an embodiment of the present disclosure, the second source follower 143 may receive the fine ramp signal from the ramp signal generator 141, and the first source follower 144 may receive a ground voltage. The second capacitor C2_FS may sample the fine ramp signal. The second capacitor C2_FS may sample a sum of the residual voltage of the first capacitor C2_CS and the fine ramp signal. In an embodiment of the present disclosure, the second capacitor C2_FS uses the residual voltage of the first capacitor C2_CS, so that voltage control necessary for a fine conversion operation can be simplified.

The comparator 145 may generate the comparison signal COMP_OUT by comparing the voltage stored in the second capacitor C2_FS with the voltage stored in the third capacitor C1, corresponding to the reception of the fine ramp signal. The controller 146 may generate lower bits of the bit data DOUT by counting the comparison signal COMP_OUT.

In an embodiment of the present disclosure, each of the source followers 143 and 144 may include a transistor which connects the source and the ground to each other, and a ramp signal may be applied to a gate terminal of the transistor. The source followers 143 and 144 may transfer voltages VRAMP_COARSE and VRAMP_FINE of the received ramp signal to the capacitors C2_CS and C2_FS connected thereto.

In an embodiment of the present disclosure, the analog-digital converter 142 may further include switches S2 which connect output and input terminals of the comparator 145 to each other. The switches S2 may be used for a reset operation of the analog-digital converter 142. The analog-digital converter 142 may perform the reset operation before an operation of generating the bit data DOUT is performed.

Figure 4:
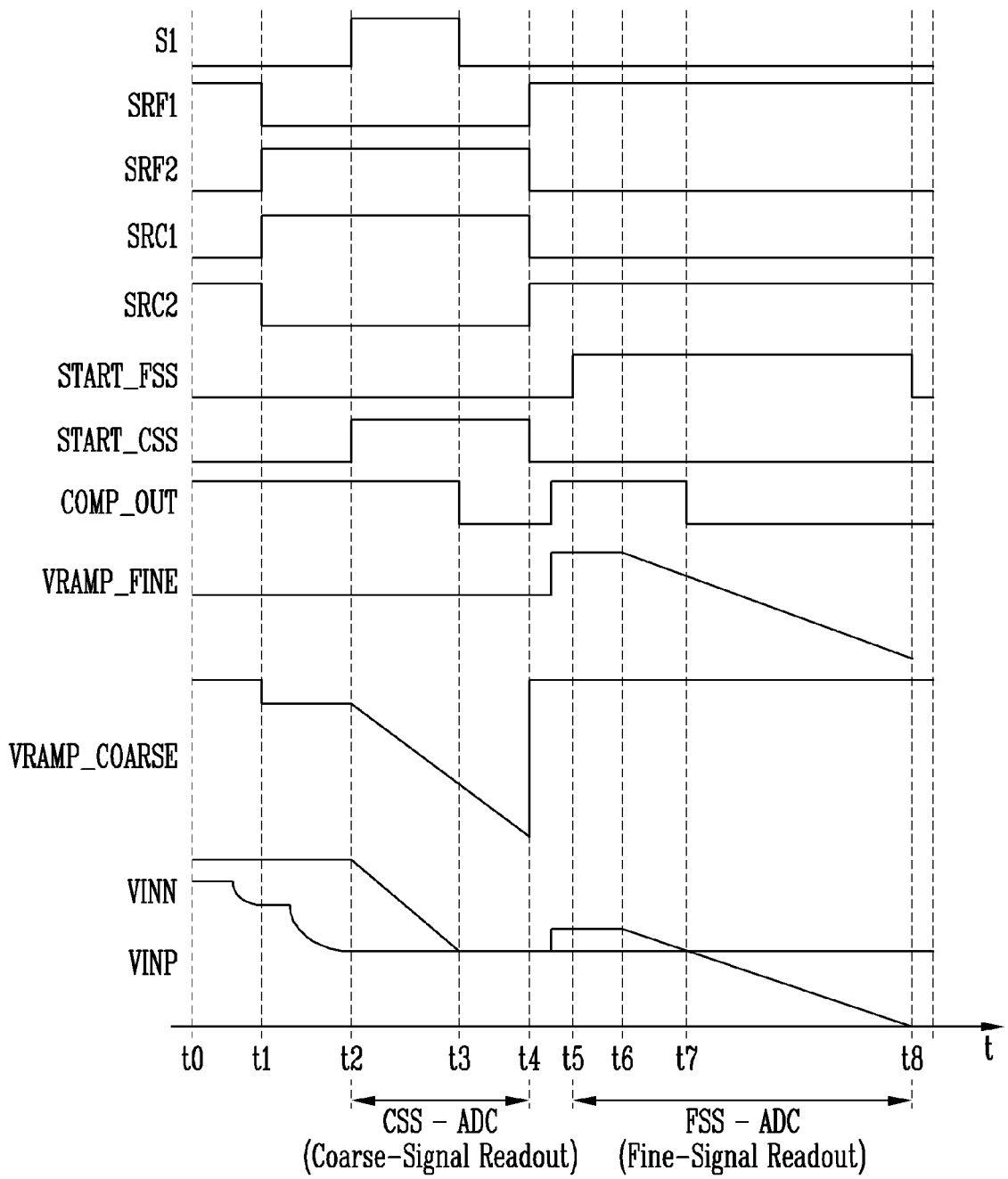
FIG. 4 is a timing diagram illustrating signals indicated in the circuit diagram shown in FIG. 3.

FIG. 4 is a timing diagram illustrating signals indicated in the circuit diagram shown in FIG. 3.

Referring to FIG. 4, potentials of signals applied to the switches and signals of nodes while the 2-step single slope analog-digital converting operation is performed may be illustrated. In FIG. 4, it may be assumed that the analog-digital converter performs a reset operation before a time t0. An analog pixel signal may be sampled, so that a voltage corresponding to a pixel signal is stored in the third capacitor.

At a time t1, control signals applied to the ramp switches SRC1, SRC2, SRF1, and SRF2 included in the ramp signal generator may be changed. A turn-on control signal may be applied to the first ramp switch SRC1 and the fourth ramp switch SRF2, and a turn-off control signal may be applied to the second ramp switch SRC2 and the third ramp switch SRF1. The ramp signal generator may output a coarse ramp signal to the analog-digital converter, corresponding to the control signals received to the ramp switches SRC1, SRC2, SRF1, and SRF2.

At a time t2, the coarse ramp signal request START_CSS may be applied to the ramp signal generator. A voltage corresponding to the coarse ramp signal may be stored in the first capacitor, corresponding to the reception of the coarse ramp signal. At the time t2, the switch S1 is turned on, and therefore, the voltage stored in the first capacitor may be transferred to the second capacitor. The voltage stored in the first capacitor may be applied to the positive input terminal VINP of the comparator.

In a period t2 to t3, the voltage of the first capacitor, which is applied to the positive input terminal VINP of the comparator, is higher than a voltage of the third capacitor, which is applied to the negative input terminal VINN of the comparator, and therefore, the output value of the comparison signal COMP_OUT may be maintained as HIGH.

At a time t3, the voltage of the third capacitor, which is applied to the negative input terminal VINN of the comparator, becomes equal to the voltage of the first capacitor, which is applied to the positive input terminal VINP of the comparator. Therefore, the output value of the comparison signal COMP_OUT may be changed to LOW, and the turn-off control signal may be applied to the switch S1. A residual voltage of the first capacitor may be stored in the second capacitor, corresponding to turn-off of the switch S1.

In a period t3 to t4, the voltage of the third capacitor, which is applied to the negative input terminal VINN of the comparator, is lower than the voltage of the first capacitor, which is applied to the positive input terminal VINP of the comparator, and therefore, the output value of the comparison signal COMP_OUT may be maintained as LOW. Because the switch S1 is turned off during the period t3 to t4, the voltage applied to the positive input terminal VINP of the comparator may be constantly maintained.

At a time t4, the coarse ramp signal request is ended, and the control signals applied to the ramp switches SRC1, SRC2, SRF1, and SRF2 may be changed. The turn-off control signal may be applied to the first ramp switch SRC1 and the fourth ramp switch SRF2, and the turn-on control signal may be applied to the second ramp switch SRC2 and the third ramp switch SRF1. The ramp signal generator may output a fine ramp signal to the analog-digital converter, corresponding to the control signals received to the ramp switches SRC1, SRC2, SRF1, and SRF2.

A potential of the fine ramp signal may be increased between the time t4 and a time t5. The second capacitor may sample the residual voltage of the first capacitor and the fine ramp signal. The voltage of the second capacitor, which is applied to the positive input terminal VINP of the comparator, may be increased corresponding to the increased potential of the fine ramp signal, and the output value of the comparison signal COMP_OUT may be changed to HIGH.

At the time t5, the fine ramp signal request START_FSS may be applied to the ramp signal generator. During t5 to t8, the comparator may output a comparison signal COMP_OUT obtained by comparing the voltage of the second capacitor, which is applied to the positive input terminal VINP of the comparator, with the voltage of the third capacitor, which is applied to the negative input terminal VINN of the comparator.

At a time t7, the output value of the comparison signal COMP_OUT may be changed to LOW, corresponding to that the voltage of the second capacitor, which is applied to the positive input terminal VINP of the comparator, and the voltage of the third capacitor, which is applied to the negative input terminal VINN of the comparator, become the same.

In an embodiment of the present disclosure, a period t2 to t4 may be a period in which a coarse conversion operation of determining upper bits of the bit data by comparing the coarse ramp signal and the pixel signal with each other is performed. The period t5 to t8 may be a period in which a fine conversion operation of determining lower bits of the bit data by comparing the fine ramp signal and the pixel signal with each other is performed.

Figure 5:
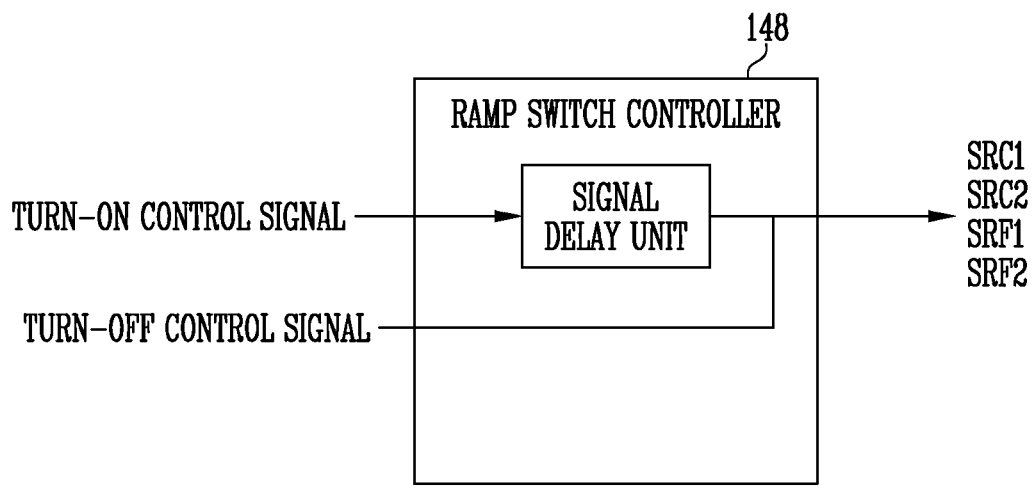
FIG. 5 is a diagram illustrating a ramp switch controller in accordance with an embodiment of the present disclosure.

FIG. 5 is a diagram illustrating a ramp switch controller in accordance with an embodiment of the present disclosure.

Referring to FIG. 5, some of the control signals transferred to the ramp switches may be delayed by a predetermined time. The ramp signal generator may include a ramp switch controller 148 which delays the turn-on control signal input to the ramp switches SRC1, SRC2, SRF1, and SRF2.

The turn-on operation or the turn-off operation may be performed on the ramp switches SRC1, SRC2, SRF1, and SRF2 for each switch pair. For example, when the first ramp switch SRC1 is turned on, the second ramp switch SRC2 may be turned on. When the turn-on/turn-off operation of the ramp switches SRC1, SRC2, SRF1, and SRF2 is simultaneously performed, a path may be formed between the source and the ground or the reference voltage input terminal instead of between the source and a ramp signal output terminal. The ramp signal generator may not be normally operated, and trouble may occur in the ramp signal generator.

In an embodiment of the present disclosure, the turn-on control signal applied to the ramp switches SRC1, SRC2, SRF1, and SRF2 forming switch pairs may be delayed by the predetermined time, so that an abnormal operation of the ramp signal generator can be prevented. Specifically, the ramp switch controller 148 may divide the control signals applied to the ramp switches SRC1, SRC2, SRF1, and SRF2 into the turn-on control signal and the turn-off control signal. The ramp switch controller 148 may transfer the turn-on control signal and the turn-off control signal to the ramp switches SRC1, SRC2, SRF1, and SRF2 through different paths.

For example, the ramp switch controller 148 may transfer the turn-on control signal to the ramp switches SRC1, SRC2, SRF1, and SRF2 through a signal delay unit. When the turn-on control signal is delayed, the turn-on/turn-off operation is not simultaneously performed on the ramp switches SRC1, SRC2, SRF1, and SRF2 included in the ramp signal generator, and therefore, the ramp signal generator may be normally operated.

The ramp switch controller 148 does not delay the turn-off control signal but may transfer the turn-off control signal to the ramp switches SRC1, SRC2, SRF1, and SRF2. In another embodiment of the present disclosure, the ramp switch controller 148 may delay only the turn-off control signal instead of the turn-on control signal and transfer the turn-off control signal to the ramp switches SRC1, SRC2, SRF1, and SRF2.

Figure 6:
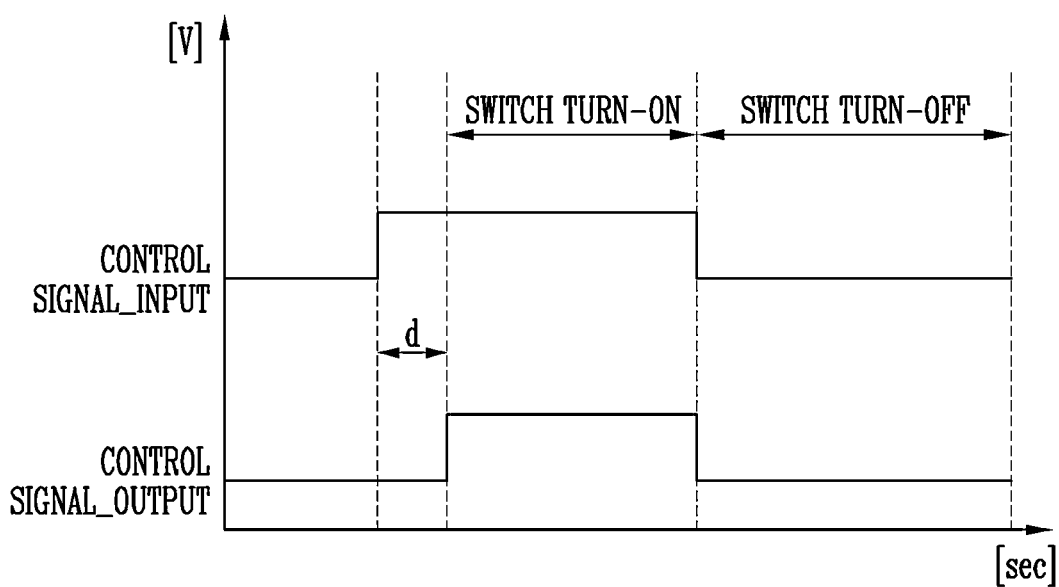
FIG. 6 is a diagram illustrating input/output control signals of the ramp switch controller shown in FIG. 5.

FIG. 6 is a diagram illustrating input/output control signals of the ramp switch controller shown in FIG. 5.

Referring to FIG. 6, the switch control signal may be input to the ramp switch controller, and the ramp switch controller may delay and output only the turn-on control signal. In FIG. 6 a time for which the turn-on control signal is delayed may be a predetermined time d.

A control signal applied to the ramp switches SRC1, SRC2, SRF1, and SRF2 may be the turn-on control signal or the turn-off control signal. The ramp switch controller may delay only the turn-on control signal among the control signals input to the ramp switches SRC1, SRC2, SRF1, and SRF2 by the predetermined time d and output the delayed turn-on control signal. The ramp switch controller may differently set paths through which the turn-on control signal and the turn-off control signal are transferred. The ramp switch controller may allow the signal delay unit to be included in only the path through which the turn-on control signal is transferred.

The ramp switch controller may output the turn-off control signal without any delay. In an embodiment of the present disclosure, the ramp switches SRC1, SRC2, SRF1, and SRF2 may be prevented from being simultaneously turned on/turned off.

For example, at the time t4 shown in FIG. 4, the operations of the ramp switches SRC1, SRC2, SRF1, and SRF2 may be changed. The second ramp switch SRC2 and the third ramp switch SRF1 may be turned on, and the first ramp switch SRC1 and the fourth ramp switch SRF2 may be turned off. The turn-on control signal applied to the second ramp switch SRC2 and the third ramp switch SRF1 may be delayed by the predetermined time d to be input. The second ramp switch SRC2 and the third ramp switch SRF1 may be turned on after the second ramp switch SRC2 and the third ramp switch SRF1 are delayed by the time d at the time t4, and the first ramp switch SRC1 and the fourth ramp switch SRF2 may be turned off at the time t4.

Figure 7:
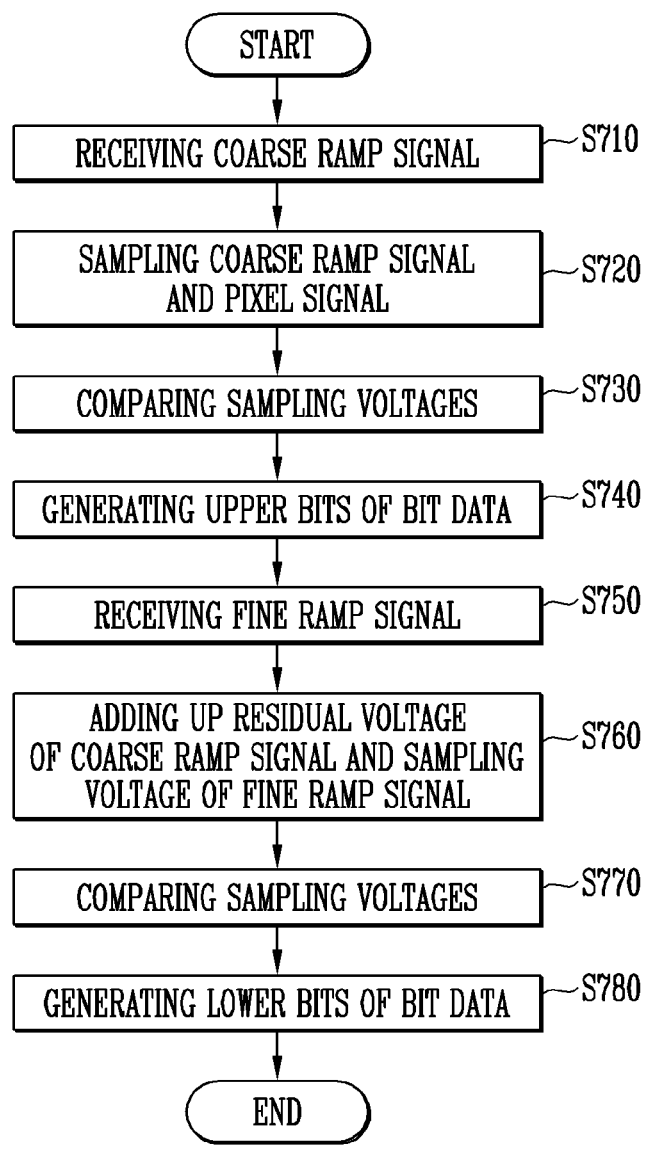
FIG. 7 is a flowchart illustrating a signal converting method in accordance with an embodiment of the present disclosure.

FIG. 7 is a flowchart illustrating a signal converting method in accordance with an embodiment of the present disclosure.

Referring to FIG. 7, the image sensor may perform a 2-step single slope analog-digital converting operation. An analog pixel signal may be converted into high-resolution bit data. The analog-digital converter receives a coarse ramp signal or a fine ramp signal from the ramp signal generator, and generates bit data by comparing the coarse ramp signal or the fine ramp signal with the analog pixel signal.

In step S710, the analog-digital converter may receive the coarse ramp signal from the ramp signal generator. The analog-digital converter may include the first source follower, and the first source follower may transfer a voltage of the coarse ramp signal to the first capacitor.

The ramp signal generator may output the coarse ramp signal or the fine ramp signal at different output terminals. The ramp signal generator may output the coarse ramp signal by transmitting control signals to the ramp switches, corresponding to a coarse ramp signal request, and output a reference voltage at an output terminal of the fine ramp signal.

In step S720, the analog-digital converter may sample the coarse ramp signal and store a voltage corresponding to the coarse ramp signal in the first capacitor. In an embodiment of the present disclosure, the voltage corresponding to the coarse ramp signal may be a first sampling voltage. The analog-digital converter may sample a pixel signal and store a pixel voltage corresponding to the pixel signal in the third capacitor.

In step S730, the comparator may compare the first sampling voltage with the pixel voltage stored in the third capacitor. The comparator may generate a comparison signal, based on a comparison result. An output value of the comparison signal may be changed corresponding to that the first sampling voltage is lower than or equal to the pixel voltage. Specifically, when the first sampling voltage is lower than the pixel voltage, the output value of the comparison signal may be changed from HIGH to LOW.

The controller which is included in the analog-digital converter may transmit a turn-off control signal to the switch which connects the first capacitor and the second capacitor to each other, corresponding to the change in the output value of the comparison signal. The second capacitor store a residual voltage stored in the first capacitor. In an embodiment of the present disclosure, the residual voltage may be the first sampling voltage.

In step S740, the controller may generate upper bits of the bit data, based on the comparison signal. The controller may count the comparison signal, and calculate upper bits of the bit data, based on the counted value. The upper bits of the bit data may be stored in the latch of the controller.

In step S750, the second source follower may receive the fine ramp signal from the ramp signal generator. The second source follower may transfer a voltage of the fine ramp signal to the second capacitor.

The ramp signal generator may output a ground voltage at an output terminal of the coarse ramp signal. The ramp signal generator may transfer, to the ramp switches, control signals opposite to the control signals when the coarse ramp signal is generated.

In step S760, the second capacitor may store a second sampling voltage obtained by adding up the first sampling voltage and the voltage received from the second source follower and sampling the sum of the first sampling voltage and the voltage received from the second source follower. The second capacitor may store the second sampling voltage, corresponding to the reception of the fine ramp signal.

In step S770, the comparator may compare the second sampling voltage and the pixel voltage with each other. The comparator may generate a comparison signal, based on a comparison result.

In step S780, the controller may generate lower bits of the bit data, based on the comparison signal. Like the step S740, the controller may generate the lower bits of the data bit by counting the comparison signal. The controller may store the lower bits of the bit data in the latch. The controller may output bit data representing a high-resolution image, based on the upper bits and the lower bits of the bit data, which are stored in the latch.

The signal converting method shown in FIG. 7 may correspond to the descriptions shown in FIGS. 2, 3, and 4.

Figure 8:
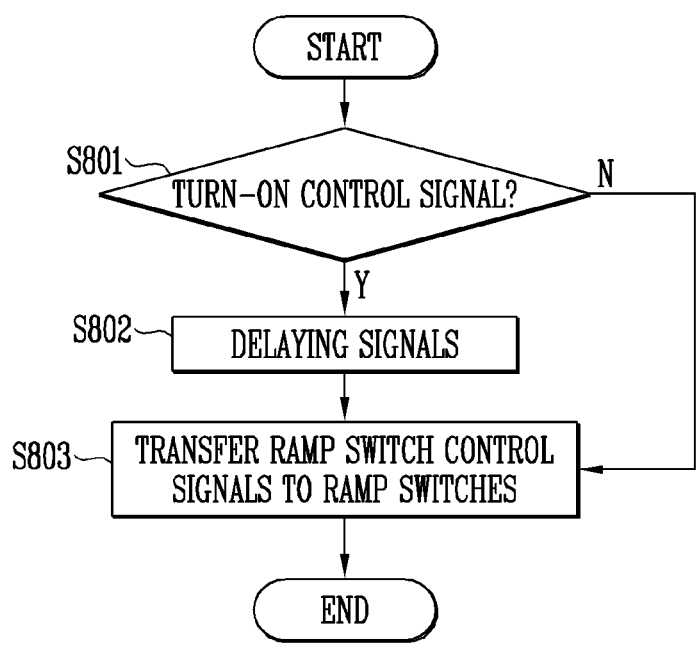
FIG. 8 is a flowchart illustrating a transfer method of ramp switch control signals in accordance with an embodiment of the present disclosure.

FIG. 8 is a flowchart illustrating a transfer method of ramp switch control signals in accordance with an embodiment of the present disclosure.

Referring to FIG. 8, the ramp switch controller may delay turn-on control signals among control signals transferred to the ramp switches. The turn-on control signal is delayed, so that a problem which may occur when the ramp switches simultaneously perform a turn-on/turn-off operation can be solved.

In step S801, the ramp switch controller may distinguish the control signals applied to the ramp switches from each other. The ramp switch controller may distinguish turn-on control signals and turn-off control signals from each other among the control signals. The ramp switch controller may output the turn-off control signals as they are.

In step S802, the ramp switch controller may delay the turn-on control signals by a predetermined time. The ramp switch controller may manage the turn-on control signals through a path different from a path of the turn-off control signal.

In step S803, the ramp switch controller may transfer ramp switch control signals to the ramp switches. The ramp switch controller does not delay the turn-off control signal but may transfer the turn-off control signal to the ramp switches. The ramp switch controller may transfer the turn-on control signal delayed by the predetermined time to the ramp switches.

The transfer method of the ramp switch control signals, which is shown in FIG. 8, may correspond to descriptions of FIGS. 5 and 6.

Figure 9:
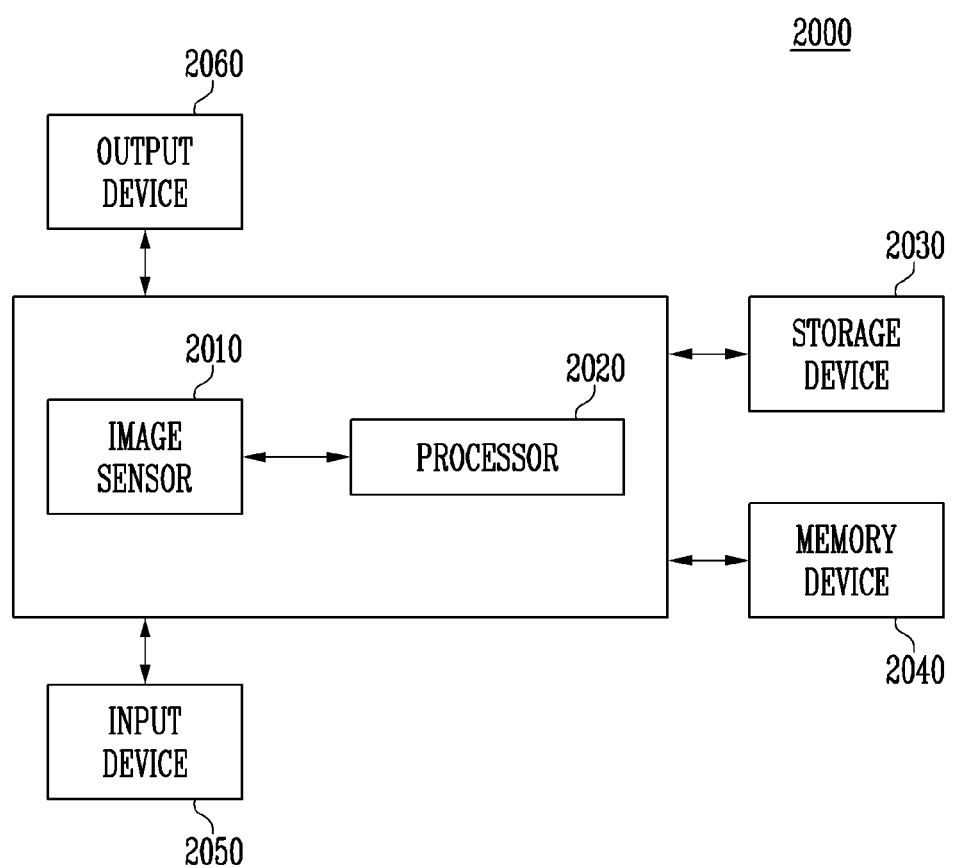
FIG. 9 is a block diagram illustrating an electronic device including an image sensor in accordance with an embodiment of the present disclosure.

FIG. 9 is a block diagram illustrating an electronic device including an image sensor in accordance with an embodiment of the present disclosure.

Referring to FIG. 9, an electronic device 2000 may include an image sensor 2010, a processor 2020, a storage device 2030, a memory device 2040, an input device 2050, and an output device 2060. Although not shown in FIG. 9, the electronic device 2000 may communicate with a video card a memory card, a USB device, and the like, or further include ports capable of communicating with other electronic devices.

The image sensor 2010 may generate image data corresponding to incident light. The image data may be transferred to the processor 2020 to be processed by the processor 2020. The image sensor 2010 may generate image data about an object input (or captured) through a lens. The lens may include at least one lens forming an optical system.

The image sensor 2010 may include a plurality of pixels. The image sensor 2010 may generate a plurality of pixel values corresponding to a photographed image in the plurality of pixels. The plurality of pixel values generated in the image sensor 2010 may be transmitted to the processor 2020. That is, the image sensor 2010 may generate a plurality of pixel values corresponding to a single frame.

In an embodiment of the present disclosure, the image sensor 2010 may convert an analog pixel signal into bit data as a digital signal. The image sensor 2010 may perform a 2-step single slope analog-digital converting operation. The image sensor 2010 may use a voltage obtained by sampling a coarse ramp signal when a voltage corresponding to a fine ramp signal is generated, so that voltage control necessary for a fine conversion operation can be simplified.

The output device 2060 may display the image data. The storage device 2030 may store the image data. The processor 2020 may control operations of the image sensor 2010, the input device 2050, the output device 2060, and the storage device 2030.

The processor 2020 may be an image processing device which performs a calculation of processing image data received from the image sensor 2010 and outputs the processed image data. The processing may be Electronic Image Stabilization (EIS), interpolation, color tone correction, image quality correction, size adjustment, or the like.

The processor 2020 may be implemented as a chip independent from the image sensor 2010. For example, the processor 2020 may be implemented with a multi-chip package. In another embodiment of the present disclosure, the processor 2020 may be included as a portion of the image sensor 2010 to be implemented as one chip.

The processor 2020 may execute and control an operation of the electronic device 2000. In accordance with an embodiment of the present disclosure, the processor 2020 may be a microprocessor, a Central Processing Unit (CPU), or an Application Processor (AP). The processor 2020 may be connected to the storage device 2030, the memory device 2040, the input device 2050, and the output device 2060 through an address bus, a control bus, and a data bus, to perform communication.

The storage device 2030 may include a flash memory device, a Solid State Drive (SSD), a Hard Disk Drive (HDD), a CD-ROM, all types of nonvolatile memory devices, and the like.

The memory device 2040 may store data necessary for an operation of the electronic device 2000. For example, the memory device 2040 may include volatile memory such as Dynamic Random Access Memory (DRAM) or Static Random Access Memory (SRAM) or may include nonvolatile memory such as Erasable Programmable Read-Only Memory (EPROM), Electrically Erasable Programmable Read-Only Memory (EEPROM), or flash memory. The processor 2020 may control the image sensor 2010, the input device 2050, and the output device 2060 by executing a command set stored in the memory device 2040.

The input device 2050 may include an input means such as a keyboard, a keypad, or a mouse, and the output device 2060 may include an output means such as a printer or a display.

The image sensor 2010 may be implemented with various types of packages. For example, components of at least a portion of the image sensor 2010 may be implemented by using packages such as Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), System In Package (SIP), Multi-Chip Package (MCP), Wafer-level Fabricated Package (WFP), and Wafer-level Processed Package (WSP).

The electronic device 2000 may represent all computing systems using the image sensor 2010. The electronic device 2000 may be implemented in the form of a packaged module, a component, or the like. For example, the electronic device 2000 may be implemented as a digital camera, a mobile device, a smart phone, a Personal Computer (PC), a tablet PC, a notebook computer, a Personal Digital Assistant (PDA), an Enterprise Digital Assistant (EDA), a Portable Multimedia Player (PMP), a wearable device, a black box, a robot, an autonomous vehicle, or the like.

In accordance with the present disclosure, there can be provided an image sensor in which a final voltage of a coarse conversion operation is stored to be used to determine a start voltage value of a fine conversion operation, so that voltage control for the fine conversion operation can be simplified.

While the present disclosure has been shown and described with reference to certain embodiments thereof, it will be understood by those skilled in the art that various changes in form and/or detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or some of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. An image sensor comprising:
a first capacitor configured to sample a coarse ramp signal;
a second capacitor configured to sample a sum of a voltage of the first capacitor and a fine ramp signal;
a comparator configured to generate a comparison signal obtained by comparing a pixel voltage received from a pixel with the voltage of the first capacitor or a voltage of the second capacitor; and
a data output unit configured to output bit data corresponding to the pixel, based on the comparison signal.

2. The image sensor of claim 1, further comprising a ramp signal generator configured to generate the coarse ramp signal or the fine ramp signal, corresponding to operations of a first switch pair or a second switch pair.

3. The image sensor of claim 2, further comprising a switch connected between the first capacitor and the second capacitor.

4. The image sensor of claim 3, further comprising a controller configured to control the switch.

5. The image sensor of claim 4, wherein the controller includes:
a counter configured to generate the bit data, based on the comparison signal; and
a latch configured to store the bit data.

6. The image sensor of claim 5, wherein the controller is configured to turn off the switch, corresponding to a change in the comparison signal.

7. The image sensor of claim 6, wherein the controller is configured to turn on the switch, corresponding to reception of the coarse ramp signal, and turn off the switch, corresponding to the coarse ramp signal being lower than or equal to the pixel signal.

8. The image sensor of claim 7, wherein the comparator is configured to change an output value of the comparison signal, corresponding to the coarse ramp signal or the fine ramp signal being lower than or equal to the pixel signal.

9. The image sensor of claim 8, wherein the counter is configured to generate upper bits of the bit data, based on the comparison signal counted until the switch is turned off.

10. The image sensor of claim 9, wherein the counter is configured to count the comparison signal until the output value of the comparison signal is changed corresponding to reception of the fine ramp signal and generate lower bits of the bit data.

11. The image sensor of claim 6, further comprising:
a third capacitor configured to sample a signal of the pixel;
a first source follower configured to receive the coarse ramp signal; and
a second source follower configured to receive the fine ramp signal.

12. The image sensor of claim 11, wherein the first capacitor is configured to store a voltage corresponding to an output signal of the first source follower, corresponding to the reception of the coarse ramp signal, and
wherein the second capacitor is configured to store the voltage of the first capacitor, corresponding to the reception of the coarse ramp signal.

13. The image sensor of claim 12, wherein the comparator is configured to compare the voltage of the first capacitor with a voltage stored in the third capacitor, corresponding to the reception of the coarse ramp signal.

14. The image sensor of claim 13, wherein the second capacitor is configured to store a sum of the voltage of the first capacitor and a voltage corresponding to an output signal of the second source follower, corresponding to the reception of the fine ramp signal.

15. The image sensor of claim 14, wherein the comparator is configured to compare a potential stored in the second capacitor with a potential stored in the third capacitor, corresponding to the reception of the fine ramp signal.

16. The image sensor of claim 2, wherein the first switch pair includes a first switch connected between a source and an output terminal of the coarse ramp signal and a second switch connected between the output terminal of the coarse ramp signal and a ground,
wherein the second switch pair includes a third switch connected between the source and an output terminal of the fine ramp signal and a fourth switch connected between the output terminal of the fine ramp signal and a reference voltage input terminal, and
wherein the ramp signal generator includes a switch controller configured to transfer control signals to the first switch, the second switch, the third switch, and the fourth switch.

17. The image sensor of claim 16, wherein the switch controller is configured to transfer a turn-on control signal to the first switch and the fourth switch and transfer a turn-off control signal to the second switch and the third switch, corresponding to a coarse ramp signal request.

18. The image sensor of claim 16, wherein the switch controller is configured to transfer a turn-on control signal to the second switch and the third switch and transfer a turn-off control signal to the first switch and the fourth switch, corresponding to a fine ramp signal request.

19. The image sensor of claim 16, wherein the switch controller includes a signal delay unit configured to delay outputs of the control signals, and
wherein the signal delay unit is configured to delay a turn-on control signal for allowing a switch to be short-circuited among the control signals and output the delayed turn-on control signal.

20. A signal converting method comprising:
storing, in a first capacitor, a first sampling voltage with respect to a coarse ramp signal received corresponding to a coarse ramp signal request;
generating a first comparison signal, based on the first sampling voltage and a pixel voltage with respect to a pixel;
storing, in a second capacitor, a second sampling voltage with respect to a sum of a fine ramp signal received corresponding to a fine ramp signal request and the first sampling voltage;
generating a second comparison signal, based on the second sampling voltage and the pixel voltage; and
generating bit data, based on the first comparison signal and the second comparison signal.

21. The signal converting method of claim 20, wherein generating the bit data includes:

generating upper bits of the bit data, which correspond to the coarse ramp signal, based on the first comparison signal; and generating lower bits of the bit data, which correspond to the fine ramp signal, based on the second comparison signal.

22. The signal converting method of claim 20, wherein storing the first sampling voltage in the first capacitor includes:

receiving the coarse ramp signal output based on control signals transferred to a plurality of ramp switches; and sampling the coarse ramp signal.

23. The signal converting method of claim 20, wherein storing the second sampling voltage in the second capacitor includes:

transferring the first sampling voltage to the second capacitor, corresponding to an output value change of the first comparison signal;

receiving the fine ramp signal; and sampling a sum of the fine ramp signal and the first sampling voltage.

24. The signal converting method of claim 23, wherein transferring the first sampling voltage to the second capacitor includes:

detecting an output value change of the first comparison signal;

transferring a turn-off control signal to a switch which connects the first capacitor and the second capacitor to each other, corresponding to the output value change; and storing the first sampling voltage in the second capacitor.

25. The signal converting method of claim 22, wherein receiving the coarse ramp signal includes:

transferring a turn-on control signal to a first ramp switch which connects a source of a ramp signal generator to an output terminal of the coarse ramp signal and a second ramp switch which connects a reference voltage input terminal to an output terminal of the fine ramp signal; and transferring a turn-off control signal to a third ramp switch which connects the source to the output terminal of the fine ramp signal and a fourth ramp switch which connects a ground to the output terminal of the coarse ramp signal.

26. The signal converting method of claim 25, wherein receiving the fine ramp signal includes:

transferring a turn-on control signal to the third ramp switch and the fourth ramp switch; and transferring a turn-off control signal to the first ramp switch and the second ramp switch.

27. The signal converting method of claim 26, wherein output of the turn-on control signal is delayed for a predetermined time as compared with the turn-off control signal.

* * * * *